United States Patent
Kline et al.

(10) Patent No.: US 6,611,429 B2
(45) Date of Patent: Aug. 26, 2003

(54) ELECTRONIC CIRCUIT TO MG BEAM GROUNDING METHOD

(75) Inventors: Daniel Kline, Fowlerville, MI (US); Hong Zhou, Plymouth, MI (US); Karen Lee Chiles, Farmington, MI (US); Lawrence LeRoy Kneisel, Novi, MI (US); Mohan R. Paruchuri, Canton, MI (US); Puqiang Zhang, Westland, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/989,887

(22) Filed: Nov. 21, 2001

(65) Prior Publication Data

US 2003/0095383 A1 May 22, 2003

(51) Int. Cl.⁷ .................................................. H05K 7/20
(52) U.S. Cl. ........................ 361/704; 29/825; 174/51; 180/90; 361/753; 439/97; 439/947
(58) Field of Search .......................... 29/825, 830, 837, 29/840, 890.03; 439/74, 92, 97, 101, 108, 485, 947; 307/9.1, 10.1; 174/51; 180/90; 165/80.3, 185, 122, 126; 361/627, 704, 707–712, 717–720, 753, 785, 799

(56) References Cited

U.S. PATENT DOCUMENTS

| | | | |
|---|---|---|---|
| 4,902,242 A | * 2/1990 | Davis et al. ................. | 439/404 |
| 5,023,752 A | * 6/1991 | Detter et al. ................. | 361/752 |
| 5,311,960 A | 5/1994 | Kukainis et al. | |
| 5,608,611 A | * 3/1997 | Szudarek et al. ............ | 361/753 |
| 5,712,764 A | 1/1998 | Baker et al. | |
| 5,762,395 A | 6/1998 | Merrifield et al. | |
| 5,934,733 A | 8/1999 | Manwaring | |
| 5,934,916 A | 8/1999 | Latal et al. | |
| 5,951,307 A | 9/1999 | Klein et al. | |
| 5,991,164 A | 11/1999 | Saito et al. | |
| 6,186,885 B1 | 2/2001 | Ahn et al. | |

FOREIGN PATENT DOCUMENTS

| | | |
|---|---|---|
| JP | 610294774 A | 12/1986 |
| JP | 030081976 A | 4/1991 |
| JP | 050074505 A | 3/1993 |
| JP | 060350269 A | 12/1994 |
| JP | 110016616 A | 1/1999 |
| JP | 110354946 A | 12/1999 |
| JP | 200037507 A | 2/2000 |
| JP | 2000251972 A | 9/2000 |
| JP | 200242915 A | 2/2002 |

* cited by examiner

Primary Examiner—Gerald Tolin
(74) Attorney, Agent, or Firm—Brinks Hofer Gilson & Lione

(57) ABSTRACT

The present invention is generally directed grounding an electrical connection to a magnesium cross beam of a motor vehicle. In order to ensure proper grounding, the cross beam is provided with a copper connector. The connector defines a first aperture. An electric circuit is preferably traced on a plastic substrate, where the substrate defines a second aperture. The substrate is placed on top of the cross beam such that the first aperture and the second aperture are aligned with each other. An attaching means such as screws is inserted through the first aperture to the second aperture such that the substrate is attached to the cross beam. In order to prevent the movement of the substrate relative to the cross beam the second aperture is provided with a washer.

25 Claims, 2 Drawing Sheets

ELECTRONIC CIRCUIT TO MG BEAM GROUNDING METHOD

TECHNICAL FIELD OF THE INVENTION

This invention relates to a method of grounding an electrical circuit to a beam structure. More particularly, the method relates to establishing a constant connection between an electrical circuit and a cross beam in a motor vehicle.

BACKGROUND OF THE INVENTION

In today's motor vehicle it is desirable to have integration between various components of a motor vehicle.

Prior art techniques have been developed where such electronic circuits have been directly mounted to the cross beam of a motor vehicle. However, such methods of attachments do not provide any grounding for the electric circuits that is required for proper function of the circuits. In addition, due to the lack of any metallurgical bonding between the circuit and the cross beam, the electrical connection established is intermittent.

SUMMARY OF THE INVENTION

In accordance with the preferred embodiment of the present invention, a structural member is formed of a magnesium metal. A connector is preferably connected to a top surface of the structural member. An electric circuit is preferably traced on a plastic substrate. The substrate is placed on top of the structural member. A fastener is used to attach the substrate to the connector such that an electrical connection is established between the substrate and the structural member.

BRIEF DESCRIPTION OF THE DRAWINGS

Further features of the invention will become apparent from the following discussion and the accompanying drawings in which.

DETAILED DESCRIPTION OF THE PREFERRED EMBODIMENT

The following description of the preferred embodiment is merely exemplary in nature and is in no way intended to limit the invention or its application or uses.

Figure 1:
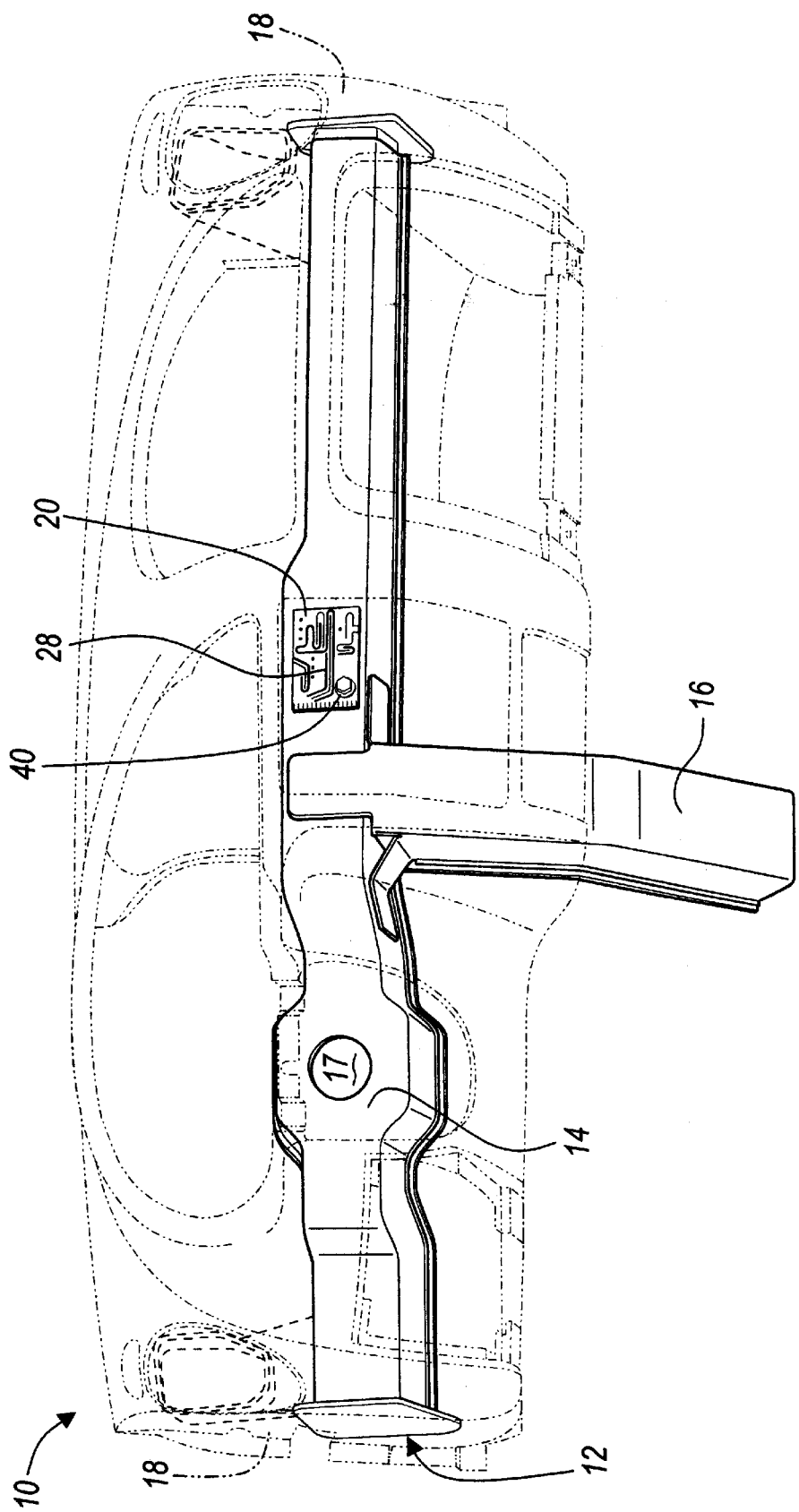
FIG. 1 is a front view of the instrument panel as installed in a motor vehicle in accordance with the teachings of the present invention.

Referring in particular to the FIG. 1, an instrument panel incorporating the features of the present invention in accordance with the teachings of the present invention is designated by reference numeral 10.

The instrument panel 10 is installed in the interior of a motor vehicle and includes a structural member 12. The structural member 12 consists of cross beam 14 and a support bracket 16. The cross beam 14 extends horizontally across the interior of the motor vehicle. The cross beam 14 extends from one pillar 18 to another pillar 18. Additionally, the cross beam 14 has an aperture 17 to accommodate a steering wheel. Alternatively, the cross beam 14 may have additional stamping to attach different components such as a glove compartment, an audio system, a display for the climate control, a passenger airbag, etc.

The structural member 12 forms the backbone of the instrument panel 10 and is covered with foam or resin to give the instrument panel 10 an aesthetic look. The cross beam 14 of the present invention is formed of magnesium metal or alternatively of magnesium alloy. The instrument panel 10 is an integrated instrument panel that typically provides at least one electrical circuit 20 that allows interconnection between various components within the instrument panel 10. For example, electrical connection may be provided for an audio player and corresponding display on an, LCD screen in a vehicle.

Figure 2:
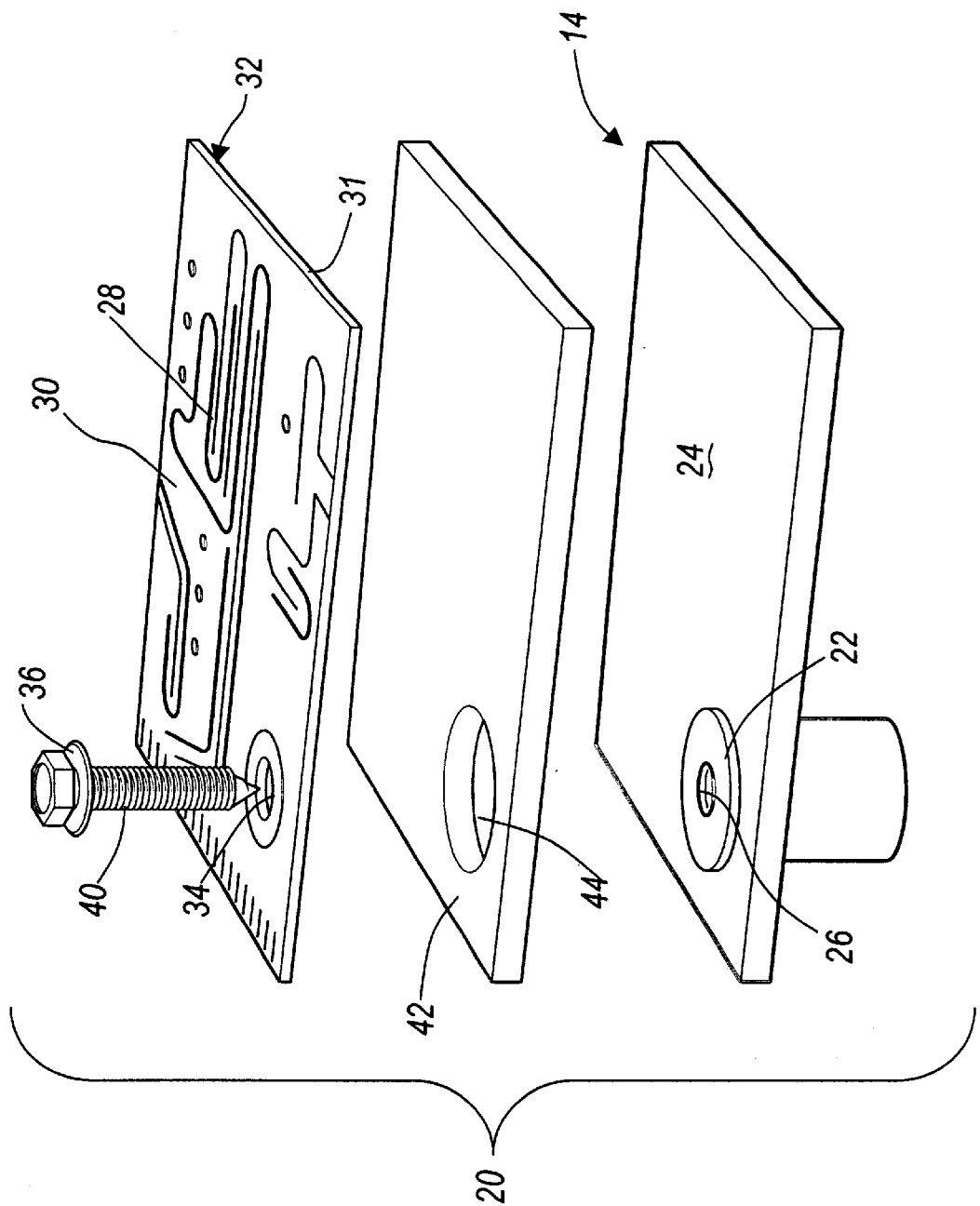
FIG. 2 is an exploded view of the magnesium beam with the copper connector.

A number of these electrical electronic connections require grounding for proper functioning, the structural member 12 serves to ground the electrical circuit 20. Referring in particular to FIG. 2, in accordance with the teachings of the preferred embodiment of the present invention, the top surface 24 of the cross beam 14 is provided with a connector 22. Preferably, the connector 22 is welded to the cross beam 14 such that a metallurgical bond is formed between the connector 22 and the top surface 24 of the cross beam 14. Alternatively, other methods of attaching the connector 22 to the cross beam 14 may be used. Preferably, the connector 22 is made of copper or of a copper alloy. Alternatively, the connector 22 may also be formed magnesium, aluminum or an aluminum alloy.

The connector 22 is provided with a first aperture 26 such that it pierces the cross beam 14. As shown, a predetermined circuit 28 is traced on a top surface 30 of a substrate 32. Preferably, the circuit 28 traced is formed of copper or copper alloys. The substrate 32, preferably is a plastic or a glass reinforced substrate. Alternatively, other materials may be used to form the substrate 32. The substrate 32 defines a second aperture 34. The substrate 32 is placed over the top surface 24 of the cross beam 14 such that a bottom surface 31 opposing top surface 30 is in contact with the cross beam 14. The substrate 32 is placed on top of the cross beam 14 such that the first aperture 26 and the second aperture 34 are aligned with each other.

The substrate 32 is attached to the cross beam 14 with the help of a fastener 40. Although in the drawing a screw type attachment is shown and described, it must be understood that fasteners are not limited to these forms. A screw 40 is preferably used to attach the substrate 32 to the cross beam 14. The screw 40 is inserted through the first aperture 26 into the second aperture 34. This arrangement provides for a contact between the connector 22 and the circuit traces 28 on the substrate 32. The screw 40 is preferably is made of tin, zinc or alloys of tin and zinc.

In order to establish a contact between the connector 22 and the circuit 28 traced on the substrate 32 a washer 36 is provided near the second aperture 34. The washer 36 will maintain the proper torque on the interface between the screw 40 and the circuit 28, preventing intermittent electrical contact. The washer will also ensure continuous contact between the circuit 28 and the cross beam 14. The washer 36 preferably is a star shape or teeth type washer. Alternatively other types of washer may be used. It is also possible to provide a washer 36 around the first aperture 26. Preferably, the washer 36 is made of copper, tin, zinc or an alloy of copper, tin or zinc. The washer 36 substantially prevents displacement of the screw 40 relative to the substrate 32 and the cross beam 14. This arrangement provides for a contact between the connector 22 and the circuit traces 28 on the substrate 32.

The present invention may also include a heat spreader 42 placed between the top surface 24 of the cross beam 14 and the bottom surface 31 of the substrate 32. Preferably, the heat spreader 42 defines a third aperture 44. The third aperture 44 is positioned such that it aligns with the first aperture 26 and the second aperture 34. In order to reduce the contact between the surface of the heat spreader 42 and the connector 22, the third aperture 44 is provided with a larger diameter than the second aperture 34 such that no contact occurs between the connector 22 and the surface of the heat spreader 42. Alternatively, the third aperture 44 may be of the same dimension as the first aperture 26 and the second aperture 34. Preferably, the heat spreader 42 is made of aluminum. Alternatively other materials may be used.

The above arrangement provides for a proper grounding of the circuit 28 to the cross beam 14. This connection will ensure proper working of the electrical circuit 20. In addition the formation of a metallurgical bond between connector 22 and cross beam 14 provides a more reliable connection between the circuit 28 and the cross beam 14.

As any person skilled in the art will recognize from the previous description and from the FIGS. and claims, modifications and changes can be made to the preferred embodiment of the invention without departing from the scope of the invention as defined in the following claims.

What is claimed is:

1. A system for an motor vehicle, the system comprising:
   a structural member;
   a connector connected to the structural member;
   a substrate having an electrical circuit;
   a heat spreader between the structural member and the substrate, wherein one surface of the heat spreader is in contact with the substrate and a second surface opposite the first surface is in contact with the structural member; and
   a fastener connecting the connector and the substrate, to provide an electrical connection between the substrate and the structural member.

2. The system of claim 1, wherein the heat spreader is made of aluminum.

3. The system of claim 1, wherein the connector defines a first aperture and the substrate defines a second aperture, wherein the first aperture is aligned with the second aperture.

4. The system of claims 3, further comprising a washer placed near the second aperture.

5. The system of claime 4, wherein the washer is made of a material consisting of copper, tin, zinc or an alloy of copper, tin or zinc.

6. The system of claim 1, wherein the fastener is a threaded screw.

7. The system of claim 7, wherein the fastener is made of a material selected from a group consisting of tin, zinc or alloys of tin and zinc.

8. The system of claim 1, wherein the connector is selected from a group consisting of copper, copper alloy, magnesium, aluminum or aluminum alloy.

9. The system of claim 1, wherein the structural member is a magnesium cross beam.

10. A grounding device in a motor vehicle for grounding electrical traces on a substrate, the device comprising:
    a connector attached to a structural member of the motor vehicle;
    a heat spreader between the structural member and the substrate for absorbing heat generated by the electrical traces, wherein the heat spreader is in contact with the substrate and the structural member; and
    a fastener extending through the substrate to the connector to provide an electrical contact between the substrate and the structural member.

11. The device of claim 10, wherein the heat spreader is made of aluminum.

12. The device of claim 10, wherein the connector defines a first aperture and the substrate defines a second aperture such that first aperture is aligned with the second aperture.

13. The device of claim 12, further comprising a washer placed near the second aperture.

14. The device of claim 13, wherein the washer is made of a material consisting of copper, tin, zinc or an alloy of copper, tin or zinc.

15. The device of claim 10, wherein the fastener is a threaded screw.

16. The device of claim 15, wherein the fastener is made of a material selected from a group consisting of tin, zinc or alloys of tin and zinc.

17. The device of claim 10, wherein the connector is made of a material selected from a group consisting of copper, copper alloy, magnesium, aluminum or aluminum alloy.

18. A method for grounding an electronic circuit to a structural member in a vehicle, the method comprising:
    welding a connector to the structural member, wherein the connector defines a first aperture;
    providing a substrate having an electronic circuit, wherein the substrate defines a second aperture;
    placing a heat spreader between the structural member and the substrate, wherein the heat spreader defines a third aperture;
    placing the substrate on top of the structural member;
    aligning the first aperture with the second aperture;
    inserting a fastener through the first aperture to the second aperture
    connecting the substrate to the structural member; and
    establishing an electrical contact between the substrate and the structural member.

19. The method of claim 18, further comprising:
    aligning the third aperture with the first aperture and the second aperture, such that the fastener passes through the third aperture.

20. The method of claim 18, wherein the heat spreader is made of aluminum.

21. The method of claim 18, wherein the step of establishing an electrical contact comprises the step of providing a washer near the second aperture.

22. The method of claim 21, wherein the washer is made of a material consisting of copper, tin, zinc or an alloy of copper, tin or zinc.

23. The method of claim 18, wherein the fastener is a threaded screw.

24. The method of claim 23, wherein the fastener is made of a material selected from a group consisting of tin, zinc or alloys of tin and zinc.

25. The method of claim 18, wherein the connector is made of a material selected from a group consisting of copper, copper alloy, magnesium, aluminum or aluminum alloy.

* * * * *